United States Patent
Okuno

(10) Patent No.: US 9,054,269 B2
(45) Date of Patent: Jun. 9, 2015

(54) SEMICONDUCTOR LIGHT-EMITTING DEVICE

(75) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 308 days.

(21) Appl. No.: 13/637,955

(22) PCT Filed: Mar. 15, 2011

(86) PCT No.: PCT/JP2011/001491
§ 371 (c)(1),
(2), (4) Date: Sep. 27, 2012

(87) PCT Pub. No.: WO2011/121911
PCT Pub. Date: Oct. 6, 2011

(65) Prior Publication Data
US 2013/0015487 A1    Jan. 17, 2013

(30) Foreign Application Priority Data
Mar. 30, 2010 (JP) .................. 2010-079190

(51) Int. Cl.
*H01L 33/00* (2010.01)
*H01L 33/20* (2010.01)

(52) U.S. Cl.
CPC .............. *H01L 33/20* (2013.01); *H01L 33/007* (2013.01)

(58) Field of Classification Search
CPC ......... H01L 33/20; H01L 33/60; H01L 33/62; H01L 33/54; H01L 33/58
USPC .................. 257/98, 99, 81, 79, 100
See application file for complete search history.

(56) References Cited

U.S. PATENT DOCUMENTS

| | | | |
|---|---|---|---|
| 7,078,252 B2* | 7/2006 | Uemura | 438/22 |
| 2005/0212002 A1 | 9/2005 | Sanga et al. | |
| 2010/0308437 A1 | 12/2010 | Okuno et al. | |

FOREIGN PATENT DOCUMENTS

| | | |
|---|---|---|
| JP | 10-215031 (A) | 8/1998 |
| JP | 2003-282942 (A) | 10/2003 |
| JP | 2005-317931 (A) | 11/2005 |
| JP | 2009-54898 (A) | 3/2009 |
| JP | 2009-203151 (A) | 9/2009 |
| WO | WO 98/34304 (A1) | 8/1998 |

OTHER PUBLICATIONS

International Search Report (ISR) (PCT Form PCT/ISA/210) dated May 31, 2011, in PCT/JP2011/001491.

* cited by examiner

*Primary Examiner* — Hoa B Trinh
(74) *Attorney, Agent, or Firm* — McGinn IP Law Group, PLLC

(57) ABSTRACT

To improve light extraction efficiency.
A semiconductor light-emitting device wherein each layer is formed of a Group III nitride-based compound semiconductor. The light-emitting device comprises a sapphire substrate having a plurality of stripe-patterned grooves 11 arranged in parallel to a first direction (x axis) on a surface of the substrate 10, a dielectric 15 discontinuously formed at least in the first direction on the surface 10*a* of the sapphire substrate and in the grooves 11, a base layer being grown on side surfaces of the grooves and made of a Group III nitride-based compound semiconductor covering the surface 10*a* of the sapphire substrate and the top surfaces 15*a* of the dielectrics 15, and a device layer constituting a light-emitting device formed on the base layer.

20 Claims, 4 Drawing Sheets

SEMICONDUCTOR LIGHT-EMITTING DEVICE

TECHNICAL FIELD

The present invention relates to a Group III nitride-based compound semiconductor light-emitting device exhibiting improved light extraction efficiency.

BACKGROUND ART

A Group III nitride-based compound semiconductor light-emitting device has been widely used, and its characteristics are being extensively improved. A Group III nitride-based compound semiconductor light-emitting device is generally produced by epitaxially growing a Group III nitride-based compound semiconductor on a sapphire substrate or other hetero-substrate. It is an important task to improve light extraction efficiency in this semiconductor light-emitting device. To improve external light extraction efficiency, Patent Document 1 discloses that a dielectric made of $SiO_2$ etc., having a lower refractive index than that of GaN is formed in a stripe pattern on a sapphire substrate, and GaN is grown from an exposed surface of the substrate to cover the top surface of the dielectric by vapor phase epitaxy.

Patent Document 2 discloses that a plurality of grooves is formed in a stripe pattern in parallel to a m-axis direction on an a-plane sapphire substrate, and GaN is grown from c-plane side surfaces of the grooves, in the c-axis direction perpendicular to the side surfaces, thereby GaN having a m-plane main surface is formed. Thus, in Patent Document 2, GaN having a main surface which is a non-polar plane is obtained.

PRIOR ART DOCUMENTS

Patent Documents

Patent Document 1: Japanese Patent Application Laid-Open (kokai) No. 2009-54898
Patent Document 2: Japanese Patent Application Laid-Open (kokai) No. 2009-203151

SUMMARY OF INVENTION

Problems to be Solved by the Invention

In both Patent Documents 1 and 2, the grooves are formed in a stripe pattern and concaves or convexes are periodically repeated on the substrate as viewed in a cross section perpendicular to the stripe direction of the stripe pattern. Therefore, a light propagating in a direction perpendicular to the stripe direction on the substrate is scattered on an embossed surface and easily extracted to the outside. However, a light component propagating in the stripe direction passes through the convexes and the concaves, and is reflected and guided by the sidewalls of the grooves. Since no reflecting surface is present in the propagating direction, the light is not scattered and extracted to the outside.

When the grooves are formed in a lattice pattern, a light propagating in a direction perpendicular to the stripe is also scattered compared to when the grooves are formed in a stripe pattern, thereby light extraction efficiency is improved. As in Patent Document 2, when the main surface is a non-polar plane, light extraction efficiency can be improved. In the growth method of Patent Document 2, when the grooves are formed in a lattice pattern on the substrate, a plane orientation is different among the sidewalls of the grooves, leading to different growth orientations, and thus a uniform semiconductor layer having a non-polar plane as a main surface cannot be obtained. Therefore, the grooves formed on the substrate had to be in a stripe pattern.

The present invention has been accomplished in order to solve the aforementioned problems, and its object is to improve external light extraction efficiency in the semiconductor light-emitting device in which a plurality of grooves is formed in a stripe pattern in parallel on the substrate.

Means for Solving the Problems

In a first aspect of the present invention, there is provided a semiconductor light-emitting device wherein each layer is made of a Group III nitride-based compound semiconductor, comprising a substrate on which a plurality of stripe-patterned grooves are arranged in parallel to a first direction, a plurality of dielectrics formed on a surface of the sapphire substrate and in the grooves, the dielectrics being discontinuous at least in the first direction, a base layer comprising a Group III nitride-based compound semiconductor, which is grown on the side surfaces of the grooves and covers the surface of the sapphire substrate and the top surfaces of the dielectrics, and device layers constituting the light-emitting device, which are formed on the base layer.

A single layer film of oxide or nitride such as silicon oxide ($SiO_x$), silicon nitride ($Si_xN_y$), titanium oxide ($TiO_x$), and zirconium oxide ($ZrO_x$), or a multiple layer film of these materials may be used as the dielectric. Particularly when a double protective film having a structure of silicon nitride ($Si_xN_y$) on silicon oxide ($SiO_x$) is used, dissolution of $SiO_x$ to diffuse to GaN is prevented, which is preferable. Any refractive index can be set by using $SiO_xN_y$ to change the composition ratios x and y. Therefore, light extraction efficiency can be improved by properly setting the composition ratios x and y, properly setting the refractive index of the dielectric relative to the refractive indices of the sapphire substrate and the base layer. The dielectric film can be formed by a vapor phase method such as deposition, sputtering and CVD.

In the present invention, a plurality of dielectrics may be continuously formed in a stripe pattern in the second direction crossing the first direction on the top surface of the substrate.

In the present invention, a plurality of dielectrics may be discontinuously formed along the second direction crossing the first direction on the top surface of the substrate.

In the present invention, the second direction is preferably perpendicular to the first direction. The second direction along which a plurality of dielectrics is arranged is a direction not parallel to the first direction a stripe extends, that is, any direction as long as it crosses the first direction. The second direction is most preferably perpendicular to the first direction.

Moreover, other invention has a characteristic that the main surface of the base layer, on which the device layer is formed, is a plane having an internal electric field intensity of 10% or less that generated in the case of c-plane. Typically, the main surface of the base layer is a non-polar plane inclined by 90° with respect to c-plane or a semi-polar plane inclined by 60° with respect to c-plane. An example of low index non-polar plane is a m-plane or an a-plane. An example of low index semi-polar plane is a (11-22) plan. When the main surface is a c-plane, the internal electric field is maximum. Thus, any plane which has an internal electric field of 10% or less the maximum value (hereinafter, defined as non-polar plane) may be used. The reason for having an internal electric field of 10% or less, is to eliminate a shift to longer wavelength side without substantially degrading light emission efficiency.

Growing crystals on the side surfaces of the stripe-patterned grooves allows a uniform crystal orientation of the main surface, and the main surface can be the same non-polar plane as mentioned above. In this case, reducing the internal electric field can improve light emission efficiency or prevent a shift to longer wavelength side. Further, in this case, if the grooves are formed in a lattice pattern on the sapphire substrate to improve light extraction efficiency, the crystal orientation of the main surface is not uniform when growing crystals on the side surfaces of the grooves. Therefore, the present invention is particularly effective for the semiconductor light-emitting device having a non-polar plane main surface.

Other invention has a characteristic that nitridation is carried out on the sapphire substrate, and an aluminum nitride layer is formed. In this case, a Group III nitride-based compound semiconductor can be laterally grown on the side surfaces of the grooves in a direction perpendicular to the side surfaces. In this case, crystals can be grown only on the side surfaces of the grooves without growing crystals on the top surface of the substrate, in a direction perpendicular to the side surfaces. The aluminum nitride layer may have a one monolayer to a few monolayer.

A buffer layer is preferably formed on the side surfaces of the grooves. In this case, a Group III nitride-based compound semiconductor can be grown only on the side surfaces without growing a Group III nitride-based compound semiconductor on the top surface of the substrate, in a direction perpendicular to the side surfaces.

Effects of the Invention

In the present invention, on the substrate on which a plurality of stripe-pattern grooves is formed in parallel, a plurality of dielectrics is formed over the top surface of the substrate and the grooves, discontinuously in a direction the grooves extend and continuously or discontinuously in a direction crossing the direction the grooves extend. Therefore, since a light propagating in a direction the grooves extend is also definitely reflected by the dielectrics, external light extraction efficiency can be improved. The present invention is particularly effective when the main surface of the base layer having thereon the device layers is a non-polar plane having an internal electric field of 10% or less that in the case of c-plane.

MODES FOR CARRYING OUT THE INVENTION

The present invention will next be described with reference to specific embodiments, which should not be construed as limiting the invention thereto.

The present invention can be employed in a flip-chip type light-emitting device as a so-called face-down type in which a semiconductor layer side is bonded to a lead frame with a sapphire substrate facing upward. However, it can also be employed in a wire-bonding type light-emitting device as a face-up type in which a reflector is formed on a backside of a sapphire substrate, and a light is output from a top surface of a semiconductor layer to the outside.

As used herein, "Group III nitride semiconductor" encompasses a semiconductor represented by the formula $Al_xGa_yIn_zN$ ($x+y+z=1$, $0 \le x, y, z \le 1$); such a semiconductor in which a portion of Al, Ga, or In is substituted by another Group 3B or Group 13 element (e.g., B or Tl), or a portion of N is substituted by another Group 5B or Group 15 element (e.g., P, As, Sb, or Bi). Specific examples of the Group III nitride semiconductor include those containing at least Ga, such as GaN, InGaN, AlGaN, and AlGaInN. The base layer is not limited to this, but undoped GaN is generally used as a base layer. Generally, Si is used as an n-type impurity, and Mg is used as a p-type impurity. The device layer is not limited to this, but an n-type contact layer made of Si-doped n-type GaN, an n-type cladding layer comprising an AlGaN and GaN or InGaN multilayer, a MQW light-emitting layer, a p-type cladding layer comprising a AlGaN and GaN or InGaN multilayer, and a p-type cladding layer made of Mg-doped p-type GaN are used. These are examples, and In is added or the aforementioned compound semiconductor with any composition ratio is used. The semiconductor light-emitting device may have any layer structure, and each layer may have any composition ratio. Molecular beam epitaxy (MBE), metal-organic vapor phase epitaxy (MOVPE), hydryde vapor phase epitaxy (HVPE), liquid phase epitaxy and others are effective for the crystal growth of the Group III nitride semiconductor layer.

Embodiment 1

Figure 1:
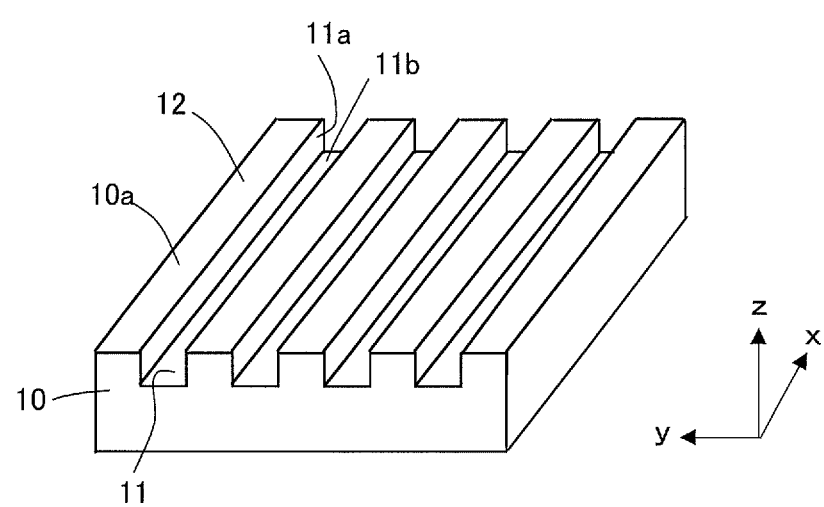
FIG. 1 A perspective view of the configuration of a sapphire substrate used in a semiconductor light-emitting device according to a specific embodiment of the present invention.

FIG. 1 shows the configuration of a sapphire substrate 10 used in a semiconductor light-emitting device 1 according to Embodiment 1. On the sapphire substrate 10, a plurality of grooves 11 extending in a first direction (x-axis direction) is formed in a stripe pattern in parallel. A plurality of grooves 11 is formed at regular intervals, in a second direction (y-axis direction) perpendicular to the first direction on the sapphire substrate 10. The remaining surface is a top surface 10a of the substrate. A stripe-pattern convex portion 12 is defined by the surface 10a and the side surfaces 11a of the grooves 11. The width of each groove 11 in the y-axis direction is 1.5 µm, and the width of each stripe-pattern convex portion 12 in the y-axis direction is 1.5 µm, and the distance between adjacent grooves 11 is 3 µm. The depth of each groove 11 is 0.1 µm. The depth of each groove 11 may be within a range from 100 Å to 3 µm.

Figure 2:
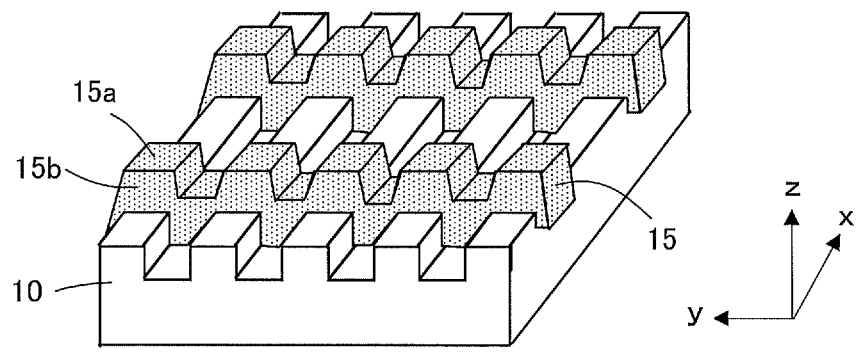
FIG. 2 A perspective view of the configuration of a sapphire substrate on which a plurality of dielectrics are formed according to the present invention.

As shown in FIG. 2, a plurality of $SiO_2$ dielectrics 15 in a stripe pattern extending in the second direction (y-axis direction) is formed in parallel on the bottom surfaces 11b and side surfaces 11a of the grooves 11, and on the surface 10a of the sapphire substrate 10. The width of each dielectric 15 in the x-axis direction is 1.5 µm, the thickness of each dielectric 15 is 0.1 µm. The thickness of each dielectric 15 may be within a range of 100 Å to 1 µm.

Figure 3:
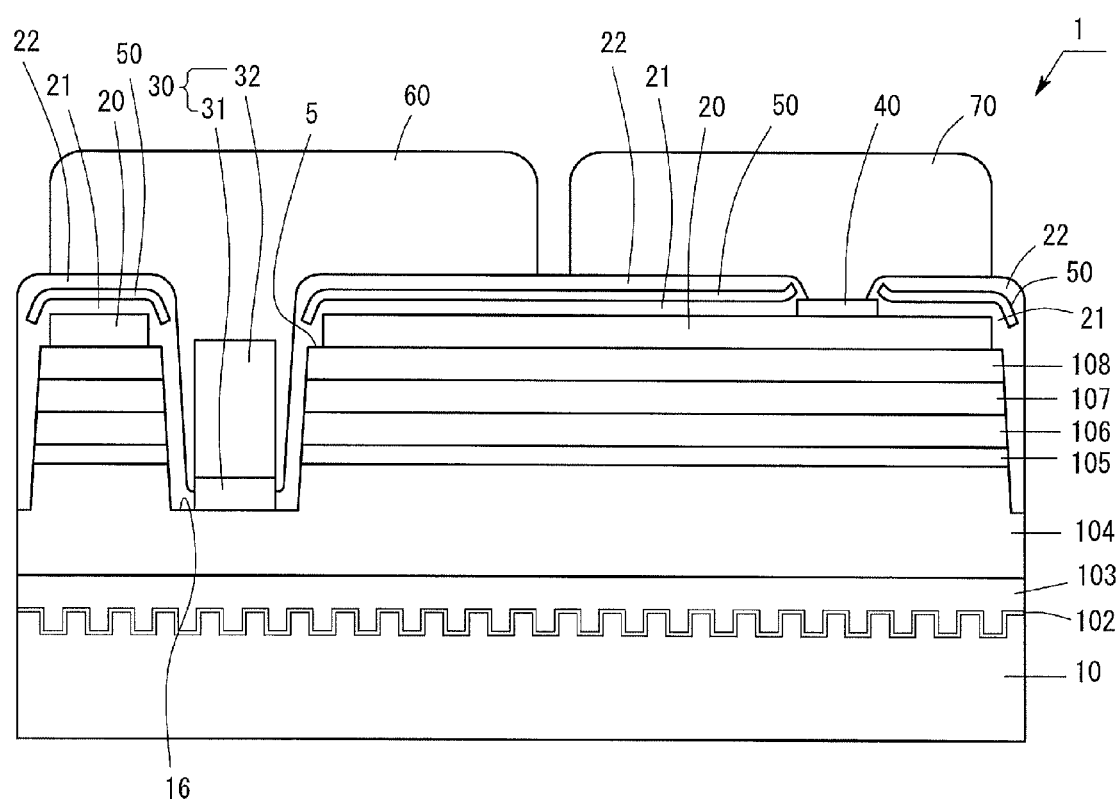
FIG. 3 A cross-section view of the configuration of a semiconductor light-emitting device of the foregoing specific embodiment.

FIG. 3 is a cross-section view of a semiconductor light-emitting device 1 according to Embodiment 1. The semiconductor light-emitting device 1 is a flip-chip type light emitting diode (LED) which emits a light having a wavelength in the blue light range. This semiconductor light-emitting device 1 emits the light having a peak wavelength of 450 nm when the forward voltage is 3.2 V and the forward current is 350 mA. Moreover, the semiconductor light-emitting device 1 is formed in a rectangular shape as viewed from the top. The semiconductor light-emitting device 1 has one side length of about 1,000 μm and the other side length of about 500 μm in plane dimension. The semiconductor light-emitting device 1 may be formed in a square with a side length from 300 μm to 1,000 μm. On the sapphire substrate 10 having the configuration shown in FIG. 2, an aluminum nitride (AlN) buffer layer 102 having a film thickness of 10 nm is deposited. That is, the buffer layer 102 is formed over the bottom surfaces 11b and side surfaces 11a of the grooves 11, the surface 10a, and the top surfaces 15a and the side surface 15b of the dielectrics 15.

On the buffer layer 102, an undoped GaN base layer 103 is formed. An n-type contact layer 104 which is a high carrier concentration n$^+$ layer made of silicon (Si)-doped GaN having a film thickness of about 3 μm to 4 μm is formed on the base layer 103. This n-type contact layer 104 has an electron concentration of $8 \times 10^{18}$/cm$^3$. Preferably, the electron concentration of this layer is as high as possible, and may be increased up to $2 \times 10^{19}$/cm$^3$. On the n-type contact layer 104, an electro-static discharge preventing layer (ESD layer) 105 is formed. The ESD layer 105 has a three-layer structure of a first ESD layer, a second ESD layer, and a third ESD layer which are deposited in this order on the n-type contact layer 104. The first ESD layer is formed of n-GaN with a Si concentration of $1 \times 10^{16}$/cm$^3$ to $5 \times 10^{17}$/cm$^3$. The first ESD layer has a thickness of 200 nm to 1,000 nm. On the surface of the first ESD layer, a few pits are formed due to threading dislocation, whose density is $1 \times 10^8$/cm$^2$ or less. The second ESD layer is formed of undoped GaN. The second ESD layer has a thickness of 50 nm to 200 nm. On the second ESD layer as well, a few pits are formed with a density of $2 \times 10^8$/cm$^2$ or more. The second ESD layer has a carrier concentration of $1 \times 10^{16}$/cm$^3$ to $1 \times 10^{17}$/cm$^3$ due to an intrinsic carrier although it is undoped. The second ESD layer may be doped with Si at a carrier concentration within a range of $5 \times 10^{17}$/cm$^3$ or less. The third ESD layer is formed of Si-doped GaN. The characteristic value defined as a product of Si concentration (/cm$^3$) and film thickness (nm) is $0.9 \times 10^{20}$ to $3.6 \times 10^{20}$ (nm/cm$^3$). For example, when the third ESD layer has a thickness of 30 nm, the Si concentration is $3.0 \times 10^{18}$/cm$^3$ to $1.2 \times 10^{19}$/cm$^3$.

On the ESD layer 105, a light-emitting layer 106 having a multiple quantum well (MQW) structure in which three cycles of undoped GaN having a film thickness of 20 nm and undoped Ga$_{0.8}$In$_{0.2}$N having a film thickness of 3 nm are deposited, is formed. A p-type layer 107 corresponding to a cladding layer made of magnesium (Mg)-doped Al$_{0.15}$Ga$_{0.85}$N and having a film thickness of approximately 60 nm is formed on the light-emitting layer 106. Furthermore, a p-type contact layer 108 made of Mg-doped GaN and having a film thickness of approximately 130 nm is formed on the p-type layer 107.

Also, a transparent conductive film 20 made of ITO is formed by MOCVD on the p-type contact layer 108. A first insulating protective film 21 made of SiO$_2$ is formed on the transparent conductive film 20. The transparent conductive film 20 has a thickness of 0.3 μm. The first insulating protective film 21 has a thickness of 200 nm. A reflector 50 made of Al or Ag and having a thickness of 100 nm is formed on the first insulating protective film 21, on top of which a second insulating protective film 22 is formed so as to have a thickness of 200 nm. Therefore, the reflector 50 is buried in an insulating protective film into which the first insulating protective film 21 and the second insulating protective film 22 are integrated. A second intermediate electrode 40 being bonded to the transparent conductive film 20 is formed in a window opened through the first insulating protective film 21, the second insulating protective film 22, and the reflector 50. The second intermediate electrode 40 has a double structure of titanium (Ti) having a thickness of 0.01 μm and gold (Au) having a thickness of 0.5 μm. The second intermediate electrode 40 may be constituted of an alloy of Ti and Au.

On the other hand, a first intermediate electrode 30 is formed on the n-type contact layer 104 exposed by etching from the p-type contact layer 108. The first intermediate electrode 30 has a double structure and is constituted by successively depositing a vanadium (V) layer 31 having a film thickness of approximately 18 nm and an aluminum (Al) layer 32 having a film thickness of approximately 1.8 μm on an electrode forming part 16 that is a partially exposed portion of the n-type contact layer 104. A rectangular second electrode 70 is provided so as to connect a plurality of second intermediate electrodes 40, and a rectangular first electrode 60 is provided so as to connect a plurality of first intermediate electrodes 30 on the second insulating protective film 22. The second electrode 70 and the first electrode 60 become bump electrodes being connected to a lead frame.

The semiconductor light-emitting device 1 according to this Embodiment comprises the aforementioned structure. Next will be described a method for producing the semiconductor light-emitting device 1.

(Groove Formation Process)

Figure 4A:
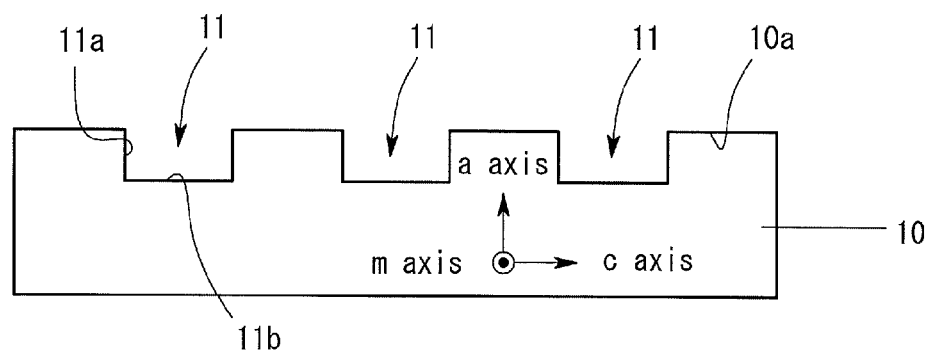
FIGS. 4A to 4D A cross-section view of a light-emitting device showing the production process of a semiconductor light-emitting device of the foregoing specific embodiment.

Firstly, a surface 10a of a sapphire substrate 10 having an a-plane main surface (corresponding to the growth substrate of the present invention) is subjected to ICP etching by use of a mask, to thereby form a plurality of grooves 11 whose longitudinal direction (first direction, x-axis direction) corresponds to the m-axis direction of the sapphire substrate 10 (FIG. 4A). The cross section of a plane (yz plane) parallel to the c-axis (y-axis direction) of each groove 11 assumes a rectangular shape. A c-plane of the sapphire substrate is exposed at the side surfaces 11a of each groove 11, and the a-plane of the sapphire substrate is exposed at the bottom surface 11b of each groove 11.

(Dielectric Formation Process)

On the surface of the sapphire substrate 10 processed as above, SiO$_2$ is evenly deposited by sputtering. Subsequently, a photoresist is evenly applied, exposed and developed in a stripe pattern in a direction (y-axis direction) perpendicular to a direction in which the grooves 11 extend, thereby forming windows extending in the direction (y-axis direction) perpendicular to the grooves, in the photoresist layer. As shown in FIG. 2, a plurality of dielectrics 15 is formed in a stripe pattern in the direction (y-axis direction) perpendicular to the longitudinal direction (x-axis direction) of the grooves 11 by etching SiO$_2$ with the remaining photoresist as a mask. The dielectrics 15 may be formed as follows: After forming a photoresist in which stripe-pattern windows are formed in the y-axis direction on the sapphire substrate 10, SiO$_2$ is evenly deposited by sputtering, and the photoresist is lifted off.

(Buffer Layer Formation Process)

Figure 4B:
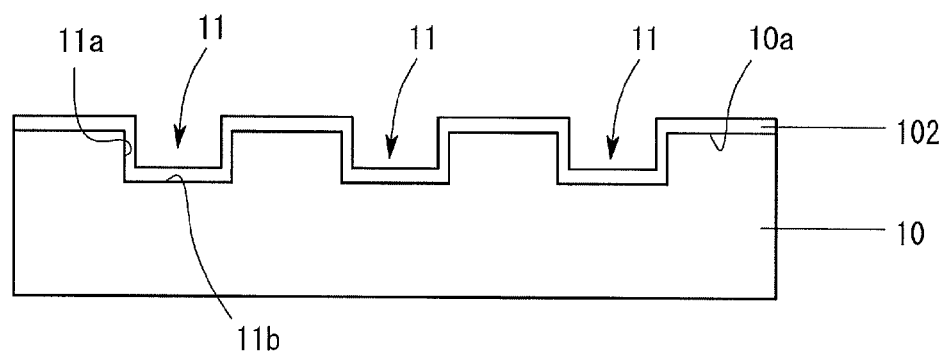

Subsequently, the sapphire substrate 10 on which a plurality of stripe-pattern grooves 11 and stripe-pattern dielectrics 15 in a direction perpendicular thereto were formed in parallel, is put in a reactive-magnetron sputtering device, and an AlN buffer layer 102 is formed at 500° C. (FIG. 4B). At this time, the AlN buffer layer is formed not only on the surface 10a (top surfaces of convex portions 12) of the sapphire substrate 10, but also on the side surfaces 11a and the bottom surfaces 11b of the grooves 11, and the top surfaces 15a and the side surfaces 15b of the dielectrics 15. However, the thickness of the AlN buffer layer 102 formed on the side surfaces 11a of the grooves 11 is smaller than that of the AlN buffer layer 102 formed on the surface 10a of the sapphire substrate 10 and on the bottom surfaces 11b of the grooves 11. As used herein, "the thickness of the AlN buffer layer 102" refers to the thickness of the AlN layer formed on the surface 10a of the sapphire substrate 10.

In general, the sapphire substrate 10 is heated to 1,000° C. or higher before forming the AlN buffer layer 102 to restore damage to the sapphire substrate 10 caused by ICP etching. In contrast, in Embodiment 1, the substrate 10 is not subjected to such a thermal treatment for restoring damage thereto, and the AlN layer is formed on the side surfaces 11a and the bottom surfaces 11b of the grooves 11 on which damage created by ICP etching remained.

The raw material gases employed for MOCVD are as follows: ammonia ($NH_3$) as a nitrogen source, trimethylgallium ($Ga(CH_3)_3$) as a Ga source, trimethylindium ($In(CH_3)_3$) as an In source, trimethylaluminum ($Al(CH_3)_3$)) as an Al source, silane ($SiH_4$) as an n-type doping gas, cyclopentadienylmagnesium ($Mg(C_5H_5)_2$) as a p-type doping gas, and hydrogen ($H_2$) or nitrogen ($N_2$) as a carrier gas.

(Heating Process)

Subsequently, the sapphire substrate 10 on which the AlN buffer layer 102 is formed is placed in an MOCVD apparatus and heated to a growth temperature in an atmosphere containing hydrogen and ammonia.

(Crystal Growth Process)

Figure 4C:
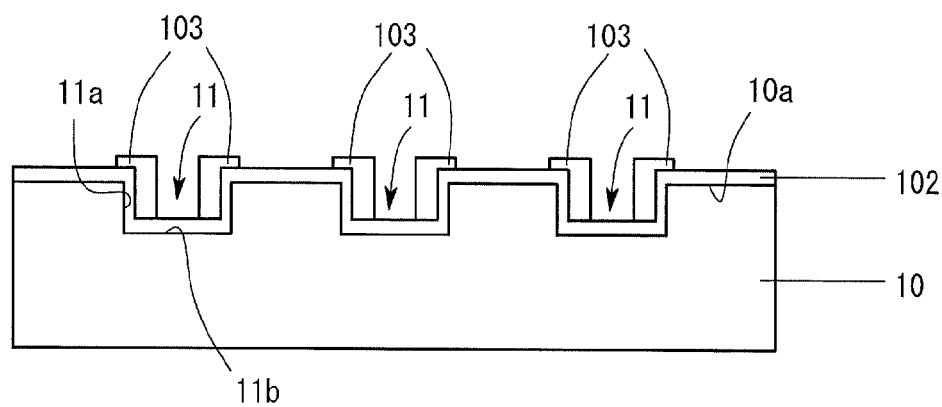

Then, TMG (trimethylgallium) is introduced in the MOCVD apparatus, and a base layer 103 made of GaN crystal is epitaxially grown on the side surfaces 11a of each groove 11 (FIG. 4c). A GaN crystal of the base layer 103 is grown so that the c-axis direction of the sapphire substrate 10 coincides with the c-axis direction of the GaN crystal. Regarding the polarity of the c-axis direction of the GaN crystal, the –c orientation of GaN corresponds to the direction from the side surfaces 11a of the groove 11 toward the inside (center) of the groove 11. That is, growth of GaN proceeds in a –c-axis direction (i.e., in a direction perpendicular to the side surfaces 11a), and the growth surface thereof assumes a -c-plane.

In this case, the thickness of the AlN buffer layer 102 and the growth temperature of GaN 13 are adjusted so that GaN crystal of the base layer 103 is not grown on the surface 10a of the sapphire substrate 10 or the bottom surfaces 11b of the grooves 11, and so that growth of GaN crystal on the side surfaces 11a of the grooves 11 proceeds dominantly in a c-axis direction. For example, the thickness of the AlN buffer layer 102 may be adjusted so as to be smaller than the minimum thickness of an AlN buffer layer which is generally formed between the sapphire substrate and a flat GaN crystal when the GaN crystal is epitaxially grown in a c-axis direction (i.e., a direction perpendicular to the main surface of the sapphire substrate), and the growth temperature of GaN crystal of the base layer 103 may be adjusted so as to be lower than a temperature at which, generally, GaN crystal is epitaxially grown in a c-axis direction (i.e., a direction perpendicular to the main surface of the sapphire substrate). Such a general AlN buffer layer is formed by sputtering for 40 seconds, and has a minimum thickness of 150 Å to 200 Å. Generally, when GaN crystal is epitaxially grown in a c-axis direction (i.e., a direction perpendicular to the main surface of the sapphire substrate), the growth temperature is higher than 1,100° C. Therefore, when the thickness of the AlN buffer layer 102 is adjusted to 150 Å or less, and the GaN growth temperature is adjusted to 1,100° C. or lower, crystal growth can be controlled so that GaN crystal of the base layer 103 is not grown on the surface 10a of the sapphire substrate 10 or the bottom surfaces 11b of the grooves 11b, and so that growth of GaN crystal on the side surfaces lie of the grooves 11 proceeds dominantly in a c-axis direction.

Figure 4D:
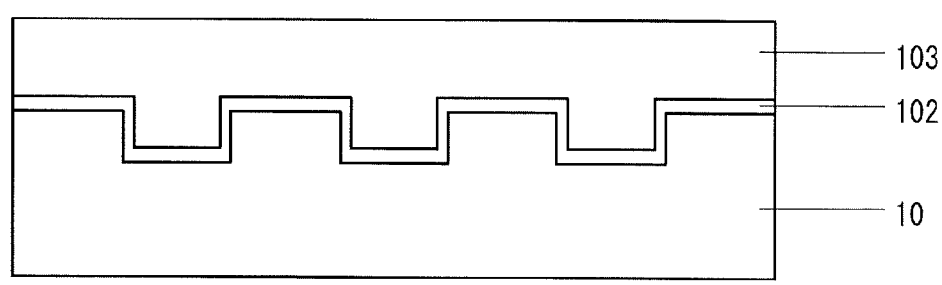

When GaN crystal of the base layer 103 is grown as described above, growth of GaN crystal of the base layer 103 proceeds rapidly toward the inside of each groove 11 in a c-axis direction (–c orientation); i.e., in a direction horizontal to the sapphire substrate 10, and also proceeds gradually in a direction perpendicular to the sapphire substrate 10 (FIG. 40). As crystal growth further proceeds, the grooves 11 are filled with GaN, and the surface 10a of the sapphire substrate 10 is gradually covered with GaN through crystal growth in directions horizontal to the sapphire substrate 10 (i.e., both –c-orientation and +c-orientation). Finally, a flat GaN crystal is formed on the sapphire substrate 10 (FIG. 4D). The GaN crystal formed on the base layer 103 has an m-plane as a main surface, since the sapphire substrate 10 has an a-plane as a main surface, and the side surfaces 11a of the grooves 11 assume c-plane. This is attributed to, for example, the difference in lattice constant between GaN and sapphire.

Moreover, a GaN crystal 13 is not grown on the top surfaces 15a or the side surfaces 15b of the dielectrics 15. At both sides in the first direction (x-axis direction) of each stripe-pattern dielectric 15, the GaN crystal laterally grown on the side surfaces 11a of each groove 11 is laterally grown on the top surfaces of each dielectric 15, and merged into a continuous layer. Through the above production method, GaN crystal having a m-plane as a main surface and exhibiting good crystallinity and surface flatness of the base layer 103 is obtained. Thus, the base layer 103 made of GaN crystal was formed.

Subsequently, device layers are formed on the GaN crystal of the base layer 103. That is, an n-type contact layer 104, an ESD layer 105, a light-emitting layer 106, a p-type layer 107, and a p-type contact layer 108, each of which is made of a Group III nitride semiconductor, are deposited in this order by MOCVD while adjusting the epitaxial growth temperature of each Group III nitride semiconductor to an optimal temperature.

The foregoing epitaxial growth of the device layers is a well known method. The device layers are epitaxially grown on the base layer 103. Subsequently, ITO is uniformly deposited in a thickness of 0.3 μm on the entire top surface of the p-type contact layer 108, thereby forming a transparent conductive film 20. Then, a photoresist is applied on the entire top surface of the transparent conductive film 20. A portion of the photoresist corresponding to an electrode forming part 16 of the n-type contact layer 104 shown in FIG. 1 is exposed, and developed, thus a window is formed thereon. A dry etching is performed using the remaining transparent conductive film 20 and photoresist as a mask to expose the n-type contact layer 104, thereby forming the electrode forming part 16. Next, a first insulating protective film 21, a reflector 50, and a second insulating protective film 22 are sequentially deposited using a well-known selective film formation technology including photoresist application, development, and photolisography, in a region other than that where a first intermediate electrode 30 and a second intermediate electrode 40 are formed. Subsequently, the first intermediate electrode 30 being bonded to the n-type contact layer 104 and the second intermediate electrode 40 being bonded to the transparent conductive film 20 are deposited using photolisography. Thereafter, a first electrode 60 is deposited so as to connect a plurality of first intermediate electrodes 30, and a second electrode 70 is deposited so as to connect a plurality of second intermediate electrodes 40, thereby completing a semiconductor light-emitting device.

In such semiconductor light-emitting device 1, a light propagating along the longitudinal direction of the grooves 11 can be scattered by the dielectrics 15. Accordingly improvement of external light extraction efficiency can be realized in the semiconductor light-emitting device 1.

In Embodiment 1, the angle between the stripe direction (first direction) of each groove 11 and the stripe direction (second direction) of each dielectric 15 is preferably 30° or more and 150° or less to efficiently scatter the light propagating along the stripe direction of the grooves 11.

Embodiment 2

Figure 5:
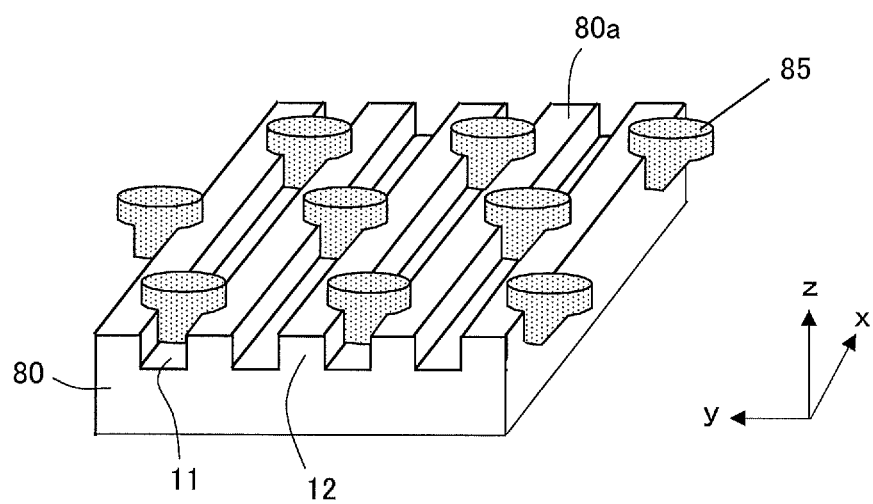
FIG. 5 A perspective view of the configuration of a sapphire substrate used in a semiconductor light-emitting device according to other embodiment.

Embodiment 2 uses a sapphire substrate 80 shown in FIG. 5. The sapphire substrate 80 is a sapphire substrate shown in FIG. 1, on which a plurality of stripe-patterned grooves 11 was formed in the same manner as Embodiment 1. On the sapphire substrate 80, a plurality of dielectrics 85 made of $SiO_2$ is formed in a dot pattern. Similarly, a semiconductor light-emitting device 1 having the configuration shown in FIG. 3 is formed using the sapphire substrate 80 as a growth substrate for the base layer 103. Each dielectric 85 is a cylinder having a diameter of 1.5 μm, and having a thickness of 0.1 μm on a top surface 80a of the sapphire substrate 80. Each dielectric 85 completely fills each groove 11 in the total width of the second direction, and covers the top surface of each convex portion 12 in a half of the width, in which the top surface is the top surface 80a of the sapphire substrate and each convex portion 12 exist at both sides of each groove 11. The dielectrics 85 are discontinuously arranged along a straight line in the second direction (y-axis direction). The semiconductor light-emitting device having such configuration exhibits improved external light extraction efficiency because the emitted light is efficiently scattered by the dielectrics 85 distributed in a dot pattern. Although the dielectrics 85 are arranged along a straight line extending in the second direction, they may be randomly arranged on a flat surface of the sapphire substrate 80. Each dielectric 85 may cover the total width of each convex portion 12.

Embodiment 3

Figure 6:
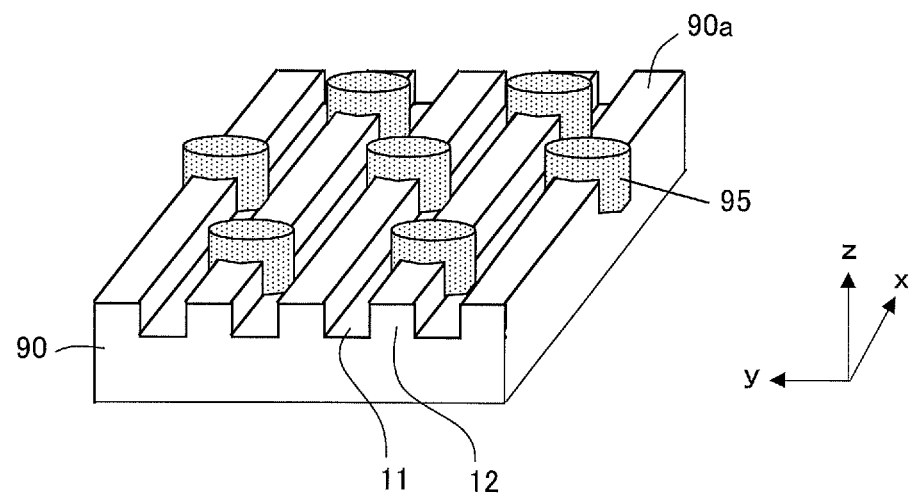
FIG. 6 A perspective view of the configuration of a sapphire substrate used in a semiconductor light-emitting device according to other embodiment.

Embodiment 3 uses a sapphire substrate 90 shown in FIG. 6. The sapphire substrate 90 is a sapphire substrate shown in FIG. 1, on which a plurality of stripe-patterned grooves 11 was formed in the same manner as Embodiment 1. On the sapphire substrate 90, a plurality of dielectrics 95 made of $SiO_2$ is formed in a dot pattern. Similarly, a semiconductor light-emitting device 1 having the configuration shown in FIG. 3 is formed using the sapphire substrate 90 as a growth substrate for the base layer 103. Each dielectric 95 is a cylinder having a diameter of 1.5 μm, and having a thickness of 0.1 μm on a surface 90a of the sapphire substrate 90. Each dielectric 95 completely covers the total width in the second direction of each convex portion 12 on the surfaces 90a of the sapphire substrate 90, and fills half the width in the second direction of each groove 11. The dielectrics 95 are discontinuously arranged along a straight line in the second direction (y-axis direction). The semiconductor light-emitting device having such configuration exhibits improved external light extraction efficiency because the emitted light is efficiently scattered by the dielectrics 95 distributed in a dot pattern. Although the dielectrics 95 are arranged along a straight line extending in the second direction, they may be randomly arranged on a flat surface of the sapphire substrate 90. Each dielectric 95 may fill the total width in the second direction of each groove 11.

The following method can be employed to laterally grow a Group III nitride semiconductor only on side surfaces 11a of grooves 11 and perpendicularly to the side surfaces.

(1) A method for forming a buffer layer on a sapphire substrate by sputtering without heating to 1,000° C. or higher for restoring damage to the sapphire substrate 10 caused by ICP etching as in Embodiment 1.

In this method, the thickness of the buffer layer 102 is preferably 55 Å or more and 150 Å or less. When the buffer layer 102 is formed so as to have a thickness of 150 Å or more, a Group III nitride semiconductor is grown on the top surface 10a of each convex portion 12 and the bottom surface 11b of each groove 11, which is not desirable. When the thickness is 55 Å or less, the crystallinity of the Group III nitride semiconductor grown on the side surfaces 11a is deteriorated. Therefore, when the buffer layer 102 has a thickness of 55 Å to 125 Å, the Group III nitride semiconductor is improved in crystallinity and surface flatness, which is desirable. More preferably, the thickness is 75 Å to 125 Å. The buffer layer having such thickness is preferably formed of AlN. When the growth temperature of the Group III nitride semiconductor is in a range from 1,020° C. to 1,100° C., the Group III nitride semiconductor can be grown mainly on the side surfaces 11a of the grooves 11 in a direction parallel to the main surface of the sapphire substrate. When the growth temperature is higher than 1,100° C., the Group III nitride semiconductor is grown on the top surface 10a of each convex portion 12 and the bottom surface 11b of each groove 11, which is not desirable. When the growth temperature is lower than 1,020° C., the crystallinity of the Group III nitride semiconductor grown on the side surfaces 11a is deteriorated. Therefore, the growth temperature of the Group III nitride semiconductor is preferably 1,020° C. or higher and 1,100° C. or lower. When the growth temperature is in a range from 1,020° C. to 1,060° C., the Group III nitride semiconductor is further improved in crystallinity and surface flatness, which is more preferable. Further preferably, the growth temperature is in a range from 1,030° C. to 1,050° C.

(2) A method for growing a Group III nitride semiconductor on side surfaces of grooves on a sapphire substrate without heating to 1,000° C. or higher for restoring damage to the sapphire substrate 10 caused by ICP etching and after heating the sapphire substrate having thereon a plurality of stripe-pattern grooves to a growth temperature of the Group III nitride semiconductor in an atmosphere containing hydrogen and ammonia.

When the growth temperature of the Group III nitride semiconductor is in a range from 1,020° C. to 1,100° C., the Group III nitride semiconductor can be grown mainly on the side surfaces 11a of the grooves 11 in a direction parallel to the main surface of the sapphire substrate. When the growth temperature is higher than 1,100° C., the Group III nitride semiconductor is grown on the top surface 10a of each convex portion 12 and the bottom surface 11b of each groove 11, which is not desirable. When the growth temperature is lower than 1,020° C., the crystallinity of the Group III nitride semiconductor grown on the side surfaces 11a is deteriorated. Therefore, the growth temperature of the Group III nitride semiconductor is preferably 1,020° C. or higher and 1,100° C. or lower. When the growth temperature is in a range from 1,020° C. to 1,060° C., the Group III nitride semiconductor is further improved in crystallinity and surface flatness, which is more preferable. Further preferably, the growth temperature is in a range from 1030° C. to 1050° C.

(3) A method forming an aluminum nitride layer on a surface of a sapphire substrate by heating the sapphire substrate having thereon a plurality of grooves and nitriding with ammonia.

The aluminum layer having a thickness of 1 Å or more and 40 Å or less can be formed by supplying aluminum or aluminum compound in the heat treatment. The aluminum layer can be formed by supplying trimethylaluminum at a temperature in a range from 300° C. to 420° C. The aluminum nitride layer can be formed on the surface of the sapphire substrate by performing heat treatment in which the temperature is increased to a specified temperature from 900° C. to 1,200° C. and kept at that specified temperature for 20 minutes or less in a hydrogen atmosphere without supplying ammonia and other reactive nitrogen compound as a possible nitrogen source of Group III nitride-based compound semiconductor instead of trimethylaluminum, and thereafter by nitriding with a supply of ammonia.

In this method, it is also effective that the sapphire substrate is subjected only to high-temperature hydrogen gas treatment. An aluminum metal layer may be formed by actively supplying aluminum source. The high-temperature hydrogen gas treatment on the sapphire substrate is, in other words, to diffuse the aluminum atoms from the sapphire substrate to the surface by etching and reduction reaction. When an aluminum source is supplied, new aluminum atoms are additionally formed. Organic aluminum compound is particularly preferable as an aluminum source in terms of reaction control to the surface of the sapphire substrate. Alkylaluminum, particularly trimethylaluminum is preferable as the organic aluminum compound. When the high-temperature hydrogen gas treatment is performed on the surface of the sapphire substrate without supplying an aluminum source, it is more preferable to carry out nitridation after decreasing the substrate temperature to a range from 300° C. to 420° C. In the high-temperature hydrogen gas treatment on the sapphire substrate, the substrate temperature may be kept for a specified time or may be cooled down as soon as it reaches the target temperature. In this case, the high-temperature hydrogen gas treatment is carried out on the sapphire substrate at a time before and after reaching the target temperature.

Through the above method, the Group III nitride semiconductor can be formed only on the side surfaces 11a of the grooves 11 on the sapphire substrate 10 in a direction perpendicular to the side surfaces 11a.

In each embodiment, ICP etching is employed to form the grooves on the growth substrate. However, other dry etching may be used, and other etching other than dry etching may also be used. Moreover, in each embodiment, AlN is used as a buffer layer. However, GaN, AlGaN, AlInN, AlGaInN, or the like may be used. Particularly when sapphire is used as a growth substrate, the Al composition ratio to the number of moles of the total Group III atoms of the buffer layer is preferably as high as possible in terms of lattice matching, and AlN is most preferable. In Embodiments, reactive magnetron sputtering is employed to form the buffer layer. However, any other sputtering may be used.

In Embodiments, the base layer is formed of GaN crystal. However, the present invention is not limited to GaN, and the base layer may be formed of a Group III nitride semiconductor such as AlN, AlGaN, InGaN, AlInN, and AlGaInN. Moreover, the plane orientation of the main surface is not limited to a m-plane orientation of a Group III nitride semiconductor. A Group III nitride semiconductor having a main surface of any orientation except for a just polar orientation, including nonpolar plane orientation or semi-polar plane orientation, can be formed, considering a plane orientation of the main surface of the growth substrate, a plane orientation of the side surfaces of the grooves formed on the growth substrate, and a lattice constant of the growth substrate. For example, a Group III nitride semiconductor having a m-plane as a main surface can be obtained by using a sapphire substrate having a c-plane as a main surface on which the grooves are formed with the side surfaces of an a-plane orientation. A Group III nitride semiconductor having an a-plane as a main surface can be obtained by using a sapphire substrate having a c-plane as a main surface on which the grooves are formed with the side surfaces of a m-plane orientation. A Group III nitride semiconductor having a m-plane as a main surface can be obtained by using a sapphire substrate having a m-plane as a main surface on which the grooves are formed with the side surfaces of an a-plane orientation. Also, a Group III nitride semiconductor having an a-plane as a main surface can be obtained by using a sapphire substrate having a m-plane as a main surface on which the grooves are formed with the side surfaces of a c-plane orientation.

In order to avoid growth of a crystal having different polarity orientations, some of side surfaces of grooves may be covered with, for example, a mask, so that a Group III nitride semiconductor crystal is not grown on the thus-covered side surfaces. For example, when the grooves 11 are formed in a stripe pattern, and one of two side surfaces 11a of each groove 11 is covered with a mask so that a Group III nitride semiconductor is grown only on the other side surface 11a, the resultant Group III nitride semiconductor exhibits polarity only in one orientation, and the semiconductor exhibits good quality.

Alternatively, in order to avoid growth of a crystal having different polarity orientations, side surfaces 11a of grooves 11 may be inclined so that the side surfaces 11a exhibits a crystal orientation in which crystal growth is less likely to occur. When, for example, a sapphire substrate is employed as a growth substrate, the smaller the angle between the side surfaces 11a of grooves 11 formed in the substrate and the c-plane or a-plane of sapphire, the more likely a crystal is grown on the side surfaces 11a. In this case, when the side surfaces 11a of the grooves 11 assume a c-plane or a-plane, a crystal is most likely to grow on the side surfaces 11a. Therefore, when, for example, side surfaces 11a of grooves 11 on which a Group III nitride semiconductor crystal is grown assume a c-plane, and the other groove side surfaces 11a on which no crystal growth is desired are inclined with respect to c-plane, growth of a crystal having different polarity orientations can be avoided.

In all the foregoing Embodiments, though the first insulating protective film 21 and the second insulating protective film 22 are formed of silicon dioxide ($SiO_2$), they can also be formed of a metal oxide such as titanium dioxide ($TiO_2$), alumina ($Al_2O_3$), and tantalum pentoxide ($Ta_2O_5$) or a resin material having electrically insulating properties such as polyimides. Moreover, the reflector 50 can also be formed of alloy containing Al or Ag as a major component in addition to Ag and Al. Besides, the reflector 50 may be formed of rhodium (Rh), ruthenium (Ru), platinum (Pt), palladium (Pd), or alloy containing at least one or more of these metals. The reflector 50 may be a distributed bragg reflector (DBR) made of a plurality of layers of two materials having a different refractive index from each other.

The second intermediate electrode 40 may comprise three layers of a Ni layer, an Au layer, and an Al layer, the Ni layer of which is bonded to the transparent electrically conductive film 10. The first electrode 60 and the second electrode 70 as a bump electrode made of an AuSn eutectic alloy, the respective surfaces of which are made of Au, are bonded to the first intermediate electrode 30 and the second intermediate electrode 40 via a first layer made of Ti, a second layer made of Ni, a third layer made of Ti and a fourth layer made of Ni, respectively. Ti of the respective first layers is one for increasing a bonding strength of the bump electrode to the first intermediate electrode 30 and the second intermediate electrode 40. The second to fourth layers are a layer for preventing the diffusion of Sn of solder. Also, at least one kind of metals selected from the group consisting of Ti, Al, Pd, Pt, V, Ir and Rh can be used as the first intermediate electrode 30. The first electrode 60 and the second electrode 70 can be formed by means of plating, screen printing, sputtering, vacuum vapor deposition or the like. The transparent electrically conductive film 20 can also be formed by means of sputtering, CVD, sol-gel or the like.

INDUSTRIAL APPLICABILITY

The present invention can be employed to improve light extraction efficiency of a semiconductor light-emitting device.

DESCRIPTION OF REFERENCE NUMERALS

1 ... Semiconductor light-emitting device
10 ... Sapphire substrate
20 ... Transparent conductive film
21 ... First insulating protective film
22 ... Second insulating protective film
30 ... First intermediate electrode
40 ... Second intermediate electrode
50 ... Reflector
60 ... First electrode
70 ... Second electrode
102 ... Buffer layer
103 ... Base layer
104 ... N-type contact layer
105 ... ESD layer
106 ... Light-emitting layer
107 ... P-type layer
108 ... P-type contact layer

The invention claimed is:

1. A semiconductor light-emitting device wherein each layer comprises a Group III nitride-based compound semiconductor, the light-emitting device comprising:
   a sapphire substrate including a plurality of stripe-patterned grooves and convex portions arranged in parallel in a first direction on a surface of the sapphire substrate;
   a dielectric formed on the sapphire substrate and in the grooves and on top surfaces of the convex portions, the dielectric being discontinuous at least in the first direction;
   a base layer comprising a Group III nitride-based compound semiconductor growing on side surfaces of the grooves, and covering a surface of the sapphire substrate and a top surface of the dielectric; and
   a device layer constituting a light-emitting device formed on the base layer.

2. The semiconductor light-emitting device according to claim 1, wherein the dielectric is continuously formed in a stripe pattern in a second direction crossing the first direction on the surface of the substrate.

3. The semiconductor light-emitting device according to claim 1, wherein the dielectric is discontinuously formed along the second direction crossing the first direction on the surface of the substrate.

4. The semiconductor light-emitting device according to claim 2, wherein the second direction comprises a direction perpendicular to the first direction.

5. The semiconductor light-emitting device according to claim 3, wherein the second direction comprises a direction perpendicular to the first direction.

6. The semiconductor light-emitting device according to claim 1, wherein a main surface of the base layer having the device layer formed thereon comprises a plane having an internal electric field of 10% or less that generated in a case of a c-plane.

7. The semiconductor light-emitting device according to claim 2, wherein a main surface of the base layer having the device layer formed thereon comprises a plane having an internal electric field of 10% or less that generated in a case of c-plane.

8. The semiconductor light-emitting device according to claim 3, wherein a main surface of the base layer having the device layer formed thereon comprises a plane having an internal electric field of 10% or less that generated in the case of a c-plane.

9. The semiconductor light-emitting device according to claim 4, wherein a main surface of the base layer having the device layer formed thereon comprises a plane having an internal electric field of 1.0% or less that generated in the case of a c-plane.

10. The semiconductor light-emitting device according to claim 1, wherein an aluminum nitride layer is formed by carrying out nitridation on the sapphire substrate.

11. The semiconductor light-emitting device according to claim 2, wherein an aluminum nitride layer is formed by carrying out nitridation on the sapphire substrate.

12. The semiconductor light-emitting device according to claim 3, wherein an aluminum nitride layer is formed by carrying out nitridation on the sapphire substrate.

13. The semiconductor light-emitting device according to claim 6, wherein an aluminum nitride layer is formed by carrying out nitridation on the sapphire substrate.

14. The semiconductor light-emitting device according to claim 1, wherein a buffer layer is formed on the side surfaces of the grooves.

15. The semiconductor light-emitting device according to claim 2, wherein a buffer layer is formed on the side surfaces of the grooves.

16. The semiconductor light-emitting device according to claim 3, wherein a buffer layer is formed on the side surfaces of the grooves.

17. The semiconductor light-emitting device according to claim 6, wherein a buffer layer is formed on the side surfaces of the grooves.

18. The semiconductor light-emitting device according to claim 1, wherein the dielectric is continuously formed in a second direction crossing the first direction on the surface of the substrate.

19. The semiconductor light-emitting device according to claim 1, wherein the dielectric is continuously formed in a stripe pattern in a second direction crossing the first direction.

20. The semiconductor light-emitting device according to claim 1, wherein the dielectric is continuously formed in a second direction crossing the first direction.

* * * * *